(12) United States Patent
Lee

(10) Patent No.: US 6,787,414 B2
(45) Date of Patent: Sep. 7, 2004

(54) CAPACITOR FOR SEMICONDUCTOR MEMORY DEVICE AND METHOD OF MANUFACTURING THE SAME

(75) Inventor: Kee Jeung Lee, Seoul (KR)

(73) Assignee: Hyundai Electronics Industries, Kyoungki-Do (KR)

( * ) Notice: Subject to any disclaimer, the term of this patent is extended or adjusted under 35 U.S.C. 154(b) by 28 days.

(21) Appl. No.: 10/335,101

(22) Filed: Jan. 2, 2003

(65) Prior Publication Data

US 2003/0132474 A1 Jul. 17, 2003

Related U.S. Application Data

(62) Division of application No. 09/603,440, filed on Jun. 23, 2001, now Pat. No. 6,525,364.

(30) Foreign Application Priority Data

Jun. 25, 1999 (KR) ............................................ 99-24220

(51) Int. Cl.[7] ......................................... H01L 21/8242
(52) U.S. Cl. ........................ 438/253; 438/250; 438/393; 438/396; 438/3; 257/295; 257/303; 257/310
(58) Field of Search ................................ 438/250–256, 438/393–399, 3; 257/295–298, 303–310

(56) References Cited

U.S. PATENT DOCUMENTS

| | | | | |
|---|---|---|---|---|
| 3,969,197 A | * | 7/1976 | Tolar et al. | |
| 4,130,694 A | * | 12/1978 | Glass et al. | |
| 5,278,091 A | * | 1/1994 | Fazan et al. | |
| 5,452,178 A | * | 9/1995 | Emesh et al. | |
| 5,455,453 A | * | 10/1995 | Harada et al. | 257/675 |
| 5,489,548 A | * | 2/1996 | Nishioka et al. | |
| 5,631,188 A | * | 5/1997 | Chang et al. | |
| 5,693,554 A | * | 12/1997 | Lee | |
| 5,741,721 A | * | 4/1998 | Stevens | |
| 5,753,945 A | * | 5/1998 | Chivukula et al. | |
| 5,763,300 A | * | 6/1998 | Park et al. | |
| 5,776,660 A | * | 7/1998 | Hakey et al. | |
| 5,837,576 A | * | 11/1998 | Chen et al. | |
| 5,859,760 A | * | 1/1999 | Park et al. | |
| 5,872,415 A | * | 2/1999 | Dreifus et al. | |
| 5,899,725 A | * | 5/1999 | Harshfield | |
| 5,910,021 A | * | 6/1999 | Tabara | |
| 5,910,880 A | * | 6/1999 | DeBoer et al. | |
| 5,936,831 A | * | 8/1999 | Kola et al. | |
| 5,977,582 A | * | 11/1999 | Fleming et al. | |
| 5,980,977 A | * | 11/1999 | Deng et al. | |
| 6,010,942 A | * | 1/2000 | Chien et al. | 438/396 |
| 6,017,789 A | * | 1/2000 | Sandhu et al. | 438/240 |
| 6,020,024 A | * | 2/2000 | Maiti et al. | 427/248.1 |
| 6,144,051 A | * | 11/2000 | Nishimura et al. | |
| 6,177,305 B1 | * | 1/2001 | Hornback et al. | |
| 6,525,364 B1 | * | 2/2003 | Lee | 257/310 |
| 2001/0024387 A1 | * | 9/2001 | Raaijmakers et al. | 365/200 |

FOREIGN PATENT DOCUMENTS

| | | | | |
|---|---|---|---|---|
| JP | 62136-35 | * | 6/1987 | |
| JP | 63038248 | * | 2/1988 | |
| JP | 01173622 | * | 7/1989 | |
| JP | 02226754 | * | 9/1990 | |
| JP | 05167008 | * | 7/1993 | |
| JP | 05335483 | * | 12/1993 | |
| JP | 06163819 | * | 6/1994 | |
| JP | 07014993 | * | 1/1995 | |
| JP | 07045467 | * | 1/1995 | |
| JP | 11074458 A | * | 3/1999 | |
| JP | 11074458 A | * | 3/1999 | ........... H01L/27/04 |
| JP | 11191612 | * | 6/1999 | |
| JP | 11233723 | * | 8/1999 | |

OTHER PUBLICATIONS

Wolf et al. (Silicon Processing for the VLSI Era, vol. 1—Process Technology, p. 169) Lattice Press, 1986.*

* cited by examiner

Primary Examiner—John F. Niebling
Assistant Examiner—Jennifer M. Kennedy
(74) Attorney, Agent, or Firm—Pillsbury Winthrop LLP

(57) ABSTRACT

Disclosed is a capacitor for semiconductor device with a dielectric layer having low leakage current and high dielectric constant. The capacitor includes: a lower electrode; a dielectric layer formed on the lower electrode; and an upper electrode formed on the dielectric layer, wherein the dielectric layer is a TiON layer.

24 Claims, 3 Drawing Sheets

CAPACITOR FOR SEMICONDUCTOR MEMORY DEVICE AND METHOD OF MANUFACTURING THE SAME

CROSS REFERENCE TO RELATED APPLICATIONS

This application is a divisional application of U.S. application Ser. No. 09/603,440, filed Jun. 23, 2000, now U.S. Pat. No. 6,525,364, the specification and drawings of which are incorporated herein by reference.

FIELD OF THE INVENTION

The present invention relates to a capacitor for semiconductor memory device and a method of manufacturing the same, and more particularly to a capacitor for semiconductor memory device capable of increasing the storage capacitance as well as preventing leakage current and a method of manufacturing the same.

BACKGROUND OF THE INVENTION

As the number of memory cells composing DRAM semiconductor device has been recently increased, occupancy dimension of each memory cell is gradually decreased. Meanwhile, capacitors formed in the respective memory cells require a sufficient capacitance for precise reading out of storage data. Accordingly, the current DRAM semiconductor device requires memory cells in which capacitors having larger capacitance as well as occupying small area is formed. The capacitance of a capacitor can be increased by using an insulator having high dielectric constant as a dielectric layer, or by enlarging the surface area of a lower electrode. In a highly integrated DRAM semiconductor device, a $Ta_2O_5$ layer having a higher dielectric constant than that of the nitride-oxide (NO) is now used as a dielectric, thereby forming a lower electrode of a 3-Dimentional structure.

FIG. 1 is a cross-sectional view showing a capacitor for conventional semiconductor memory device. Referring to FIG. 1, a gate electrode 13 including a gate insulating layer 12 at a lower portion thereof is formed according to a known technique on the upper part of a semiconductor substrate 10 which a field oxide layer 11 is formed at a selected portion thereof. A junction region 14 is formed on the semiconductor substrate 10 at both sides of the gate electrode 13, thereby forming an MOS transistor. A first interlevel insulating layer 16 and a second interlevel insulating layer 18 are formed on the upper part of the semiconductor substrate 10 in which the MOS transistor is formed. A storage node contact hole h is formed inside the first and the second interlevel insulating layers 16, 18 so that a junction region 14 is exposed. A cylinder type lower electrode 20 is formed according to a known method, inside the storage node contact hole h so as to be in contact with the exposed junction region 14. A HSG (hemi-spherical grain) layer 21 is formed on a surface of a lower electrode 20 to increase the surface area of the lower electrode 20 more. Afterwards, a rapid thermal nitridation (RTN) process is performed on the surface of the lower electrode 20 which the HSG layer 21 is formed thereon by ex situ to prevent generation of a natural oxidation layer. Next, a first $Ta_2O_5$ layer is formed on an upper part of the lower electrode 20 that is treated by the RTN process at temperature of approximately 400~450° C. to the thickness of 53~57 Å. Afterwards, an annealing step is performed at a low temperature, and then a second $Ta_2O_5$ layer is formed to the same process and same thickness as those of the first $Ta_2O_5$ layer. Sequentially, annealing steps at low and high temperatures are performed in series, thereby forming the $Ta_2O_5$ layer 23. Afterwards, to crystallize the $Ta_2O_5$ layer 23, the layer 23 is thermal-treated again at a selected temperature. An upper electrode 25 is formed of a polysilicon layer or metal layer doped on the $Ta_2O_5$ layer 23 and made of a doped polysilicon layer or a metal layer.

However, a difference in the composition rate of Ta and O is occurred since the $Ta_2O_5$ layer 23 generally has unstable stoichiometry. As a result, substitutional Ta atoms, i.e. vacancy atoms are generated in a thin film. Since those vacancy atoms are oxygen vacancies, leakage current is occurred.

Now, the $Ta_2O_5$ layer is oxidized so as to remove the substitutional Ta atoms therein in order to stabilize the unstable stoichiometry thereof. However, the following problems are caused when the $Ta_2O_5$ layer is oxidized to prevent leakage current. That is, the $Ta_2O_5$ layer has great oxidation reactivity with the lower and the upper electrodes formed of polysilicon or TiN. Accordingly, during the oxidation process for oxidizing the substitutional Ta atoms, an oxide layer having low dielectric constant is formed at an interface by reaction between the $Ta_2O_5$ layer and the lower electrode or the upper electrode. And, oxygen moves to the interface between the $Ta_2O_5$ layer and the lower electrode, thereby deteriorating homogeneity in the interface.

Further, due to the reaction between an organic substance such as $Ta(OC_2H_5)_5$ used as a precursor and $O_2$ (or $N_2O$) gas, impurities such as carbon atoms C, carbon compounds ($CH_4$, $C_2H_4$) and $H_2O$ are generated in the $Ta_2O_5$ layer. Those impurities increase leakage current in the capacitor and deteriorate the dielectric characteristics of the $Ta_2O_5$ layer. Accordingly, a capacitor of great capacitance is difficult to obtain.

Moreover, the method using the $Ta_2O_5$ layer as a dielectric layer requires an extra ex-situ process before the formation of the $Ta_2O_5$ layer and after the cleaning step. Also, the $Ta_2O_5$ layer should be deposited in double steps and two thermal processes at low and high temperatures should be performed after the deposition. Therefore, manufacturing process is cumbersome.

SUMMARY OF THE INVENTION

Accordingly, it is one object of the present invention to provide a capacitor for semiconductor device with a dielectric layer having low leakage current and high dielectric constant.

Furthermore, the other object of the present invention is to provide a method of manufacturing a capacitor for semiconductor device capable of simplifying manufacturing process thereof.

To achieve the foregoing objectives, the present invention according to one aspect includes: a lower electrode; a dielectric layer formed on the lower electrode; and an upper electrode formed on the dielectric layer, wherein the dielectric layer is a TiON layer.

Further, the present invention according to another aspect provides a method of manufacturing the capacitor of a semiconductor memory device including the steps of: forming a lower electrode on a semiconductor substrate; depositing a TiON layer as a dielectric layer on the lower electrode; and forming an upper electrode on the TiON layer.

The present invention according to still another aspect provides a method of manufacturing the capacitor of a semiconductor memory device including the steps of: forming a lower electrode on a semiconductor substrate; surface-treating to prevent a natural oxide layer from generating on the surface of the lower electrode; depositing a TiON layer on the lower electrode using an organic Ti metal precursor; thermal-treating the TiON layer; and forming an upper electrode on the TiON layer, wherein the TiON layer is formed by chemical vapor reaction of Ti chemical vapor, $NH_3$ gas and $O_2$ gas in the LPCVD chamber maintained at temperature of 300 to 600 ¤C, wherein the Ti chemical vapor is an evaporated organic Ti metal precursor.

DETAILED DESCRIPTION OF THE PREFERRED EMBODIMENTS

Embodiment 1

Figure 1:
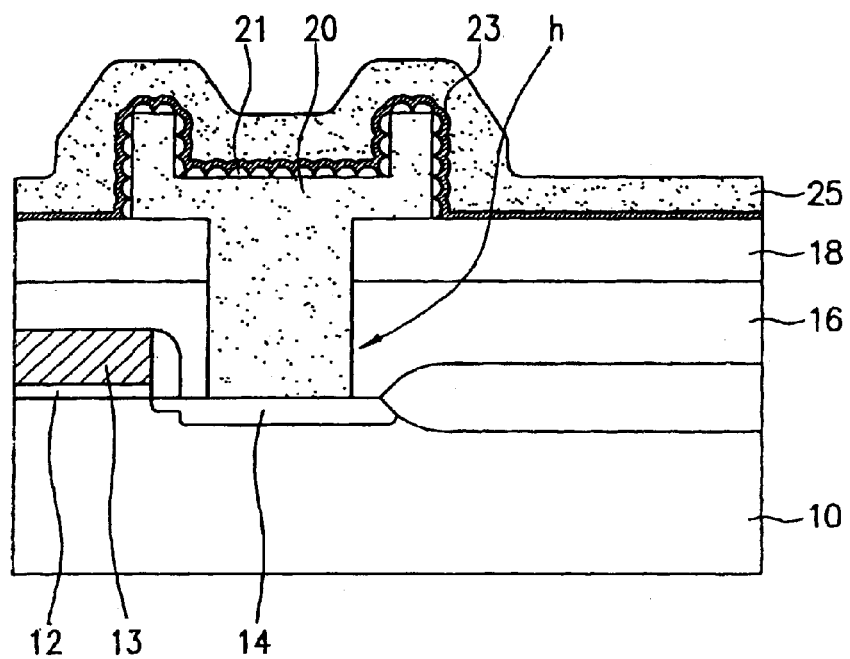
FIG. 1 is a cross-sectional view of a conventional capacitor for a semiconductor memory device.
Figure 2A:
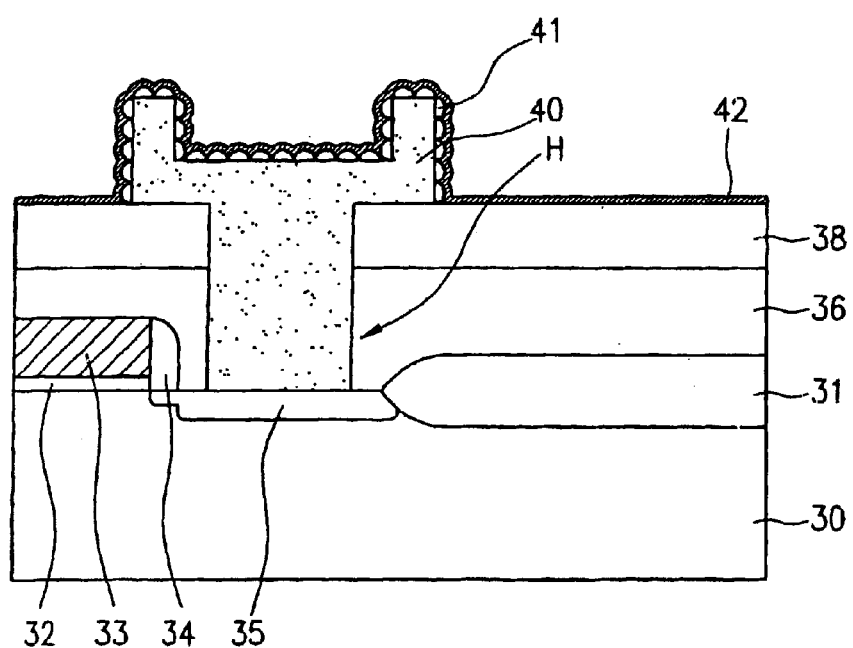
FIGS. 2A to 2D are cross-sectional views for illustrating the manufacturing steps of a capacitor for semiconductor device according to the embodiment of the present invention.

Referring to FIG. 2A, a field oxide layer 31 is formed according to a known method at a selected portion of a semiconductor substrate 30 having a selected conductivity. A gate electrode 33 having a gate insulating layer 32 at a lower portion thereof is formed on a selected upper portion of the semiconductor substrate 30, and a spacer 34 is formed according to a known method at both side-walls of the gate electrode 33. A junction region 35 is formed on both sides of the gate electrode 33 of the semiconductor substrate 30, thereby forming an MOS transistor. A first interlevel insulating layer 36 and a second interlevel insulating layer 38 are formed at the semiconductor substrate 30 in which the MOS transistor is formed. Afterward, the second and the first interlevel insulating layers 38, 36 are patterned so that a selected portion of the junction region 35 is exposed, thereby forming a storage node contact hole H. A lower electrode 40 of cylinder type or stack type is formed to be in contact with the exposed junction region 35. A HSG layer 41 for enlarging the surface area of the lower electrode 40 is formed according to a known method on the surface of the lower electrode 40.

Afterward, to restrain the generation of a low dielectric natural oxide layer at an interface of the lower electrode 40 having the HSG layer 41 and a dielectric layer to be formed later (not shown), the lower electrode 40 having the HSG layer 41 and the second interlayer insulating layer 38 are surface-treated. Herein, the surface-treatment can be performed in various methods. As one among the methods, a thermal treatment is performed in situ by using plasma in a low pressure chemical vapor deposition (LPCVD) chamber under $NH_3$ gas or $N_2/H_2$ gas atmosphere at temperature of 200~600° C. Further, as another method, the RTN is performed under 650~950° C. under $NH_3$ gas atmosphere, or a furnace treatment is performed under the same conditions as above. As an additional method, the surface of the lower electrode 40 is cleaned by HF vapor, HF solution or a HF containing compound. At this time, before or after the cleaning step, an extra interface-treating step can be performed by $NH_4OH$ solution or $H_2SO_4$ solution. In addition to the interface-treating step, also a thermal process can be performed under $N_2O$ or $O_2$ gas atmosphere, thereby improving the structural defects due to the dangle bonds on the lower electrode surface as well as improving the structural heterogeneity. As a result, generation of the natural oxide layer is restrained. Herein, when the thermal process, the RTN or the furnace treatment using plasma under $NH_3$ gas atmosphere is performed, a silicon nitride layer 42 is naturally formed on the lower electrode 40 having the HSG layer 41 and on the second interlayer insulating layer 38. In addition, when the silicon nitride layer is not formed naturally by the surface treatment, an artificial silicon nitride layer 42 is formed on the lower electrode 40 having the HSG layer 41 and on the second interlayer insulating layer 38.

Figure 2B:
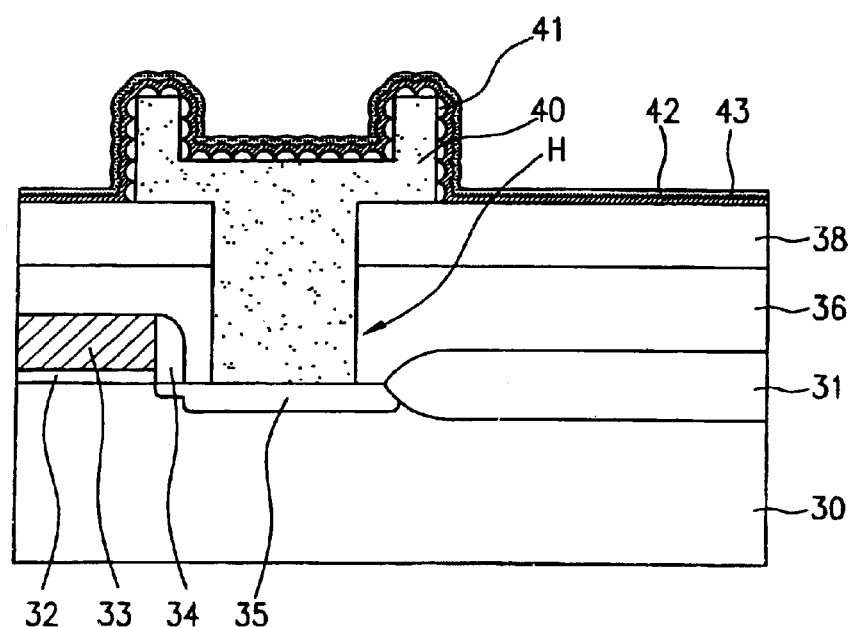

Referring to FIG. 2B, as a dielectric, a TiON layer 43 is formed by using a titanium organic metal material such as $Ti(OC_3H_7)_4$ (titanium tetra-iso-propylate) on the silicon nitride layer 42 by the LPCVD method. At this time, to minimize remaining of particles, a reaction to form the TiON layer 43 is occurred only on the wafer surface under a condition that a gas phase reaction within a chamber is extremely restrained. Herein, a precursor made of a titanium organic metal such as the $Ti(O(C_3H_7)_4$ (titanium tetra-iso-propylate) is in liquid state, it should be provided when its phase is converted into vapor state. That is, a selected amount of the precursor in liquid state is flowed using a flow controller such as MFC (mass flow controller) and then is provided into an evaporator or an evaporation tube and evaporated at temperature of 200~300° C., thereby generating a Ti chemical vapor. The Ti chemical vapor and the reaction gas i.e. $NH_3$ gas are reacted together in the LPCVD chamber maintained at temperature of 300~600° C., thereby forming an amorphous TiON layer 43.

Figure 3:
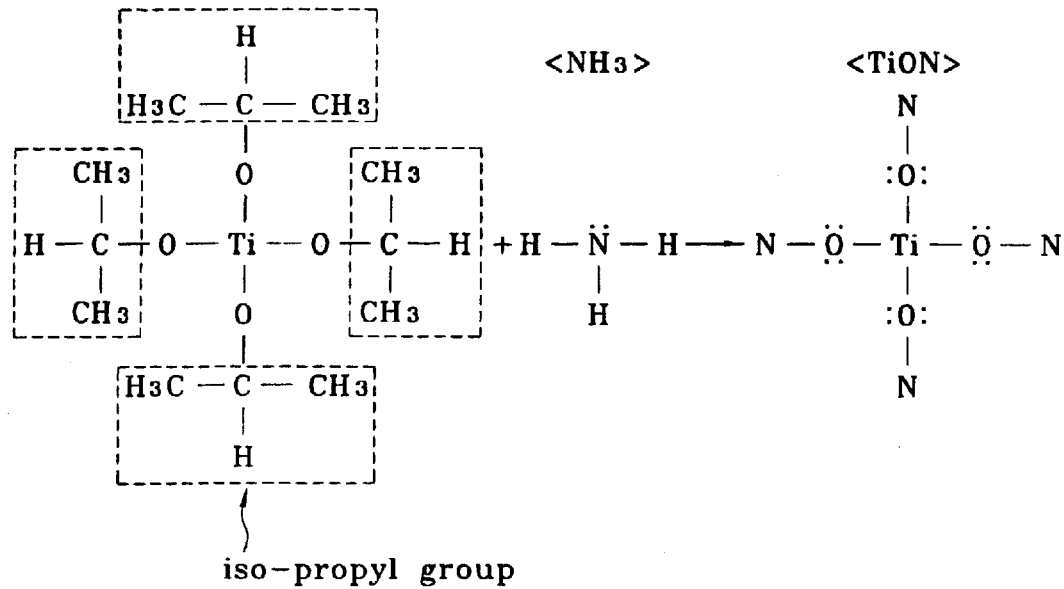
FIG. 3 is a cross-sectional view of a chemical formula for illustrating the TiON deposition process according to the present embodiment.

Refer to FIG. 3 for more detailed descriptions, in the $Ti(OC_3H_7)_4$ vapor, since the bonding energy of —O—C-radical having a relatively smaller bonding energy of 98,8 kcal/mol is broken, the iso propyl group, i.e. CH3—CH3—CH3 is dissociated. Further, the NH3 gas is disjointed by N radical and H radical, nitrogen, i.e. —N— or =N— is surface-treated with Ti—O-radical of the Ti chemical component, thereby forming the TiON layer 43.

At this time, the dissociated iso propyl group is dissociated again into C—H having biding energy of 98.8 kcal/mol and C—C having biding energy of 98.8 kcal/mol. As a result, by-products like C, CO, $CO_2$, $CH_4$, $C_2H_4$, and $H_2O$ are generated. Those by-products such as CO, $CO_2$, $CH_4$, $C_2H_4$, and $H_2O$ are all volatilized and C only remains. Herein, to remove the remaining C components, an extra $O_2$ gas injection is performed on the formation of the TiON layer. Then, the remaining C components are coupled to the $O_2$ components and volatilized all. Therefore, no impurities of C components exist in the TiON layer. In the present embodiment, no additional thermal process for removing the C component impurities is required. Herein, $NH_3$ gas and $O_2$ gas are provided by 5~1000 sccm respectively.

Figure 2C:
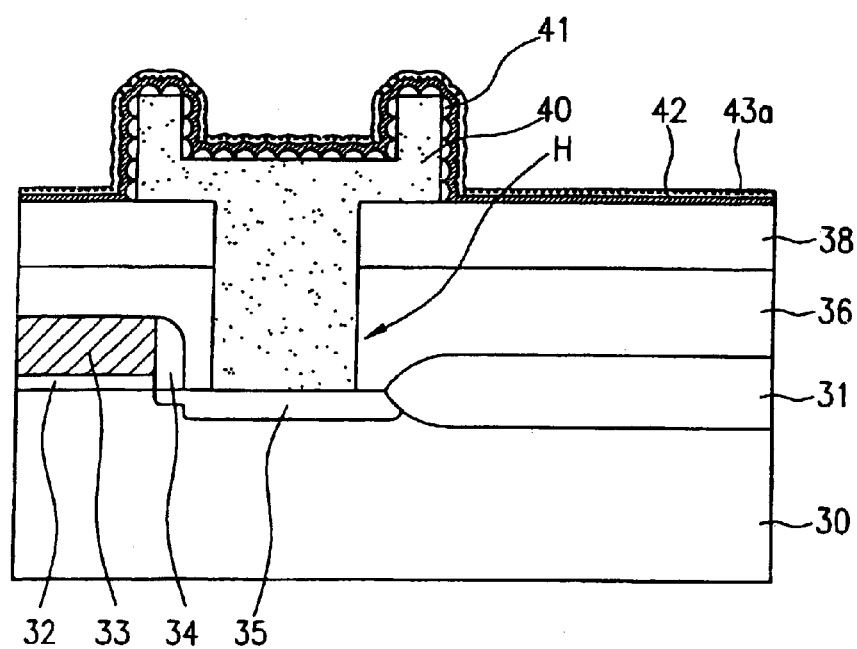

Afterward, as shown in FIG. 2C, to crystallize the amorphous TiON layer 43 and to fine the bonding structure of the same, the amorphous TiON layer is annealed in situ or ex situ by the RTP or a furnace at a chamber maintained at temperature of 600~950° C. under an atmosphere containing oxygen like $N_2O$ or $O_2$ for 30 seconds ~30 minutes. As another crystallizing method, the TiON layer is annealed by the RTP or a furnace at a chamber maintained at temperature of 700~950° C. under an atmosphere containing nitrogen like $NH_3$, $N_2/H_2$ or $N_2O$ for 30 seconds ~30 minutes.

Accordingly, processes for crystallizing and improving of homogeneity are performed simultaneously.

Figure 2D:
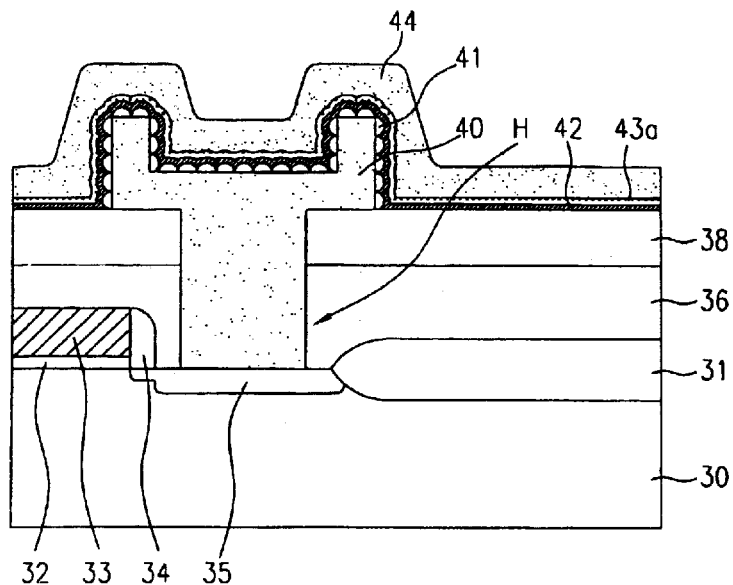

Then, as shown in FIG. 2D, an upper electrode 44 is formed on the crystallized TiON layer. Herein, the upper electrode 44 can be made of a doped polysilicon layer or a metal layer. When the metal layer is used for the upper electrode 44, one selected from TiN, TaN, W, WN, WSi, Ru, $RuO_2$, Ir, $IrO_2$, Pt can be used. When the metal layer can be performed according to a method among LPCVD, PECVD and RF magnetic sputtering methods.

Embodiment 2

The present embodiment illustrates the post process of manufacturing the TiON layer. Other details of the embodiments are identical to the first embodiment.

An amorphous TiON layer 43 is thermal-treated by plasma at temperature of 200~600° C. under $NH_3$, $N_2/H_2$ or $N_2O$ gas atmosphere. By this step, the amorphous TiON layer 43 is kept in amorphous state and structural defects such as micro cracks and pin holes occurred at the interface are improved, thereby also improving the homogeneity. Although the TiON layer 43 is in the amorphous state, its dielectric property corresponds to that of the crystalline TiON layer. As a result, a stable dielectric layer can be obtained by performing only the low temperature plasma process.

As discussed above in detail, the followings are advantages of using the TiON as a dielectric.

First, the TiON layer has high dielectric constant of 30~35 and a stable bonding structure of Ti—O—N. Consequently, the dielectric property of TiON is superior to that of NO layer and also the stoichiometry of TiON is superior to $Ta_2O_5$ layer. Therefore, no additional oxidation for stabilizing unstable stoichiometry is required, and the TiON has excellent tolerance against external electrical and high breakdown voltage and low leakage current.

Furthermore, since the TiON has very low oxidation reactivity and requires no additional oxidation for stabilizing unstable stoichiometry, there is occurred no oxidation reaction between lower and upper electrodes of a capacitor. Accordingly, it is possible to control the thickness of an equivalent dielectric layer less than 30 Å.

Since impurities do not exist in layers while depositing TiON, extra process for removing impurities is not required. Therefore, manufacturing process is simplified.

Various other modifications will be apparent to and can be readily made by those skilled in the art without departing from the scope and spirit of the present invention.

What is claim is:

1. A method of manufacturing a capacitor for a semiconductor memory device comprising:
    forming a lower electrode on a semiconductor substrate;
    depositing a TiON layer as a dielectric layer on the lower electrode;
    annealing the TiON layer in an amorphous state after forming the TION layer; and
    forming an upper electrode on the annealed TiON layer.

2. The method according to claim 1, wherein the TiON layer is formed by a chemical vapor reaction of Ti chemical vapor, $NH_3$ gas and $O_2$ gas in an LPCVD (low temperature chemical vapor deposition) chamber maintained at a temperature of 300 to 600° C., wherein the Ti chemical vapor is a evaporated precursor.

3. The method according to claim 2, wherein the $NH_3$ gas and the $O_2$ gas are supplied by 5 to 1000 sccm.

4. The method according to claim 2, wherein the precursor is Ti $(OC_3H_7)_4$.

5. The method according to claim 1, wherein a surface-treatment for preventing a natural oxide layer from generating on the surface of the lower electrode is additionally performed between forming the lower electrode and depositing the TiON layer.

6. The method according to claim 5, wherein the surface-treatment is thermal-treated at a temperature of 200 to 600° C. in the LPCVD chamber using plasma having atmosphere of $NH_3$ gas or $N_2/H_2$ gas.

7. The method according to claim 5, wherein the surface-treatment is performed by the RTN(rapid thermal treatment) at temperature of 650 to 950° C. in a chamber having an $NH_3$ gas atmosphere.

8. The method according to claim 5, wherein the surface-treatment is thermal-treated at a temperature of 650 to 950° C. in a furnace having $NH_3$ gas atmosphere.

9. The method according to claim 5, wherein during the surface-treatment, the surface of the lower electrode is cleaned using HF vapor, HF solution, or compounds containing HF.

10. The method according to claim 9, wherein an interface-treatment is additionally performed using $NH_4OH$ solution or $H_2SO_4$ solution before or after cleaning.

11. The method according to claim 5, wherein the surface-treatment is thermal-treated under atmosphere of $N_2O$ gas or $O_2$ gas.

12. The method according to claim 1, wherein the annealing step of the TiON layer is crystallized by annealing according to the RTP or in a furnace under atmosphere of a gas containing oxygen at temperature of 650 to 950° C.

13. The method according to claim 1, wherein the annealing step of the TiON layer is thermal-treated under atmosphere of a gas containing nitrogen at temperature of 600 to 950° C. in the RTP or furnace.

14. The method according to claim 1, wherein the annealing step of the TiON layer is thermal-treated under atmosphere of $NH_3$ gas or $N_2O$ gas at temperature of 200 to 600° C.

15. A method of manufacturing a capacitor for a semiconductor memory device comprising:
    forming a lower electrode on a semiconductor substrate;
    surface-treating to prevent a natural oxide layer from generating on the surface of the lower electrode;
    depositing a TiON layer on the lower electrode using an organic Ti metal precursor;
    annealing the TiON Layer, wherein the wherein the annealing step of the TiON layer is crystallized by annealing according to the RTP or in a furnace under atmosphere of a gas containing oxygen at temperature of 650 to 950° C.; and
    forming an upper electrode on the annealed TiON layer, wherein the TiON, layer is formed by chemical vapor reaction of Ti chemical vapor, $NH_3$ gas and $O_2$ gas in the LPCVD chamber maintained at temperature of 300 to 600° C., wherein the Ti chemical vapor is an evaporated organic Ti metal precursor, and
    wherein the annealing step of the TiON layer is thermal-treated under atmosphere of a gas containing nitrogen at temperature of 600 to 950° C. in the RTP or furnace.

16. The method according to claim 15, wherein the precursor is $Ti(OC_3H_7)_4$.

17. The method according to claim 16, wherein the $NH_3$ gas and the $O_2$ gas are respectively supplied by 5 to 1000 sccm.

18. The method according to claim 15, wherein the surface-treatment is thermal-treated at a temperature of 200 to 600° C. in the LPCVD chamber using plasma having atmosphere of $NH_3$ gas or $N_2/H_2$ gas.

19. The method according to claim 15, wherein the surface-treatment is performed by the RTN (rapid thermal treatment) at temperature of 650 to 950° C. in a chamber having an $NH_3$ gas atmosphere.

20. The method according to claim 15, wherein the surface-treatment is thermal-treated at a temperature of 650 to 950° C. in a furnace having $NH_3$ gas atmosphere.

21. The method according to claim 5, wherein during the surface-treatment the surface of the lower electrode is cleaned using HF vapor, HF solution, or compounds containing HF.

22. The method according to claim 21, wherein an interface-treatment is additionally performed using $NH_4OH$ solution or $H_2SO_4$ solution before or after cleaning.

23. The method according to claim 15, wherein the surface-treatment is thermal-treated under atmosphere of $N_2O$ gas or $O_2$ gas.

24. The method according to claim 1, wherein the annealing step of the TiON layer is thermal-treated under atmosphere of $NH_3$ gas or $N_2O$ gas at temperature of 200 to 600° C.

* * * * *

UNITED STATES PATENT AND TRADEMARK OFFICE
CERTIFICATE OF CORRECTION

PATENT NO. : 6,787,414 B2
DATED : September 7, 2004
INVENTOR(S) : Kee Jeung Lee

It is certified that error appears in the above-identified patent and that said Letters Patent is hereby corrected as shown below:

Title page,
Item [62], Related U.S. Application Data, replace "Division of application No. 09/603,440, filed on Jun. 23, 2001, now Pat. No. 6,525,364" with -- Division of application No. 09/603,440, filed on Jun. 23, 2000, now Pat. No. 6,525,364 --.

Signed and Sealed this

Eighteenth Day of January, 2005

JON W. DUDAS
*Director of the United States Patent and Trademark Office*